(12) United States Patent
Futakuchi et al.

(10) Patent No.: US 10,338,105 B2
(45) Date of Patent: Jul. 2, 2019

(54) CURRENT DETECTOR THAT PREVENTS FLUCTUATONS IN DETECTION SENSITIVITY

(71) Applicant: Hitachi Metals, Ltd., Tokyo (JP)

(72) Inventors: Naoki Futakuchi, Hitachinaka (JP); Naofumi Chiwata, Mito (JP); Katsuya Akimoto, Mito (JP)

(73) Assignee: Hitachi Metals, Ltd., Tokyo (JP)

( * ) Notice: Subject to any disclaimer, the term of this patent is extended or adjusted under 35 U.S.C. 154(b) by 302 days.

(21) Appl. No.: 14/943,569

(22) Filed: Nov. 17, 2015

(65) Prior Publication Data

US 2016/0146859 A1    May 26, 2016

(30) Foreign Application Priority Data

Nov. 25, 2014    (JP) .................................. 2014-238166

(51) Int. Cl.
*G01R 15/20*    (2006.01)
(52) U.S. Cl.
CPC .................................. *G01R 15/205* (2013.01)
(58) Field of Classification Search
None
See application file for complete search history.

(56) References Cited

U.S. PATENT DOCUMENTS

| 2007/0044370 A1* | 3/2007 | Shoji | .................... | G01R 15/207 |
| | | | | 43/44.98 |
| 2007/0047152 A1* | 3/2007 | Furukawa | .............. | B82Y 25/00 |
| | | | | 360/319 |
| 2011/0227560 A1* | 9/2011 | Haratani | ................ | B82Y 25/00 |
| | | | | 324/117 R |
| 2016/0131687 A1* | 5/2016 | Higashi | .................. | G01R 21/08 |
| | | | | 324/98 |

FOREIGN PATENT DOCUMENTS

| JP | 2009-250931 A | 10/2009 |
| JP | 2013-200303 | 10/2013 |
| WO | 2012/172946 A1 | 12/2012 |

OTHER PUBLICATIONS

Office Action issued in the corresponding Japanese Patent Application No. 2014-238166 dated May 8, 2018.
Office Action issued in the corresponding Japanese Patent Application No. 2014-238166 dated Dec. 25, 2018.
Office Action issued in the corresponding Chinese Patent Application No. 201510802538.9 dated Dec. 11, 2018.

* cited by examiner

*Primary Examiner* — Douglas X Rodriguez
(74) *Attorney, Agent, or Firm* — Roberts Mlotkowski Safran Cole & Calderon, P.C.

(57) ABSTRACT

A current detector includes a half-bridge configuration including first and second magnetic detection elements that are connected in series and disposed such that a magnetization direction of a magnetic pinned layer thereof is opposite to each other, and a bias magnetic field generating means for applying a bias magnetic field to the first and second magnetic detection elements. The bias magnetic field has a substantially same intensity and is formed in a direction substantially orthogonal to the magnetization direction and opposite to each other.

16 Claims, 7 Drawing Sheets

CURRENT DETECTOR THAT PREVENTS FLUCTUATONS IN DETECTION SENSITIVITY

The present application is based on Japanese patent application No. 2014-238166 filed on Nov. 25, 2014, the entire contents of which are incorporated herein by reference.

BACKGROUND OF THE INVENTION

1. Field of the Invention

The invention relates to a current detector for measuring a magnetic field generated by electric current flowing through a conductor so as to detect a value of the electric current.

2. Description of the Related Art

A current detector is known which uses a magnetoresistance effect element such as an AMR element using anisotropic magnetoresistive (AMR) effect or a GMR element using giant magnetoresistive (GMR) effect (see e.g. JP-A-2013-200303).

JP-A-2013-200303 discloses a current detector that generates a bias magnetic field of a known intensity in a direction orthogonal to a magnetic field (measuring object) of a GMR element, and then measures a voltage signal proportional to a sine value of an angle formed between a synthetic magnetic field produced by combining the magnetic field (measuring object) with the bias magnetic field and the direction of the magnetic field (measuring object), thereby detecting strength of the magnetic field (measuring object).

SUMMARY OF THE INVENTION

The current detector disclosed in JP-A-2013-200303 is adapted such that the bias magnetic field serves to decrease the hysteresis of a magnetic detection element (GMR element) constituting the current detector so as to expand the linear range thereof. On the other hand, the bias magnetic field encompasses a drawback that the detection sensitivity lowers according to an increase in the bias magnetic field. In addition, if an external magnetic field as a disturbance, which includes Earth's magnetic field or a magnetic field generated by another device, is mixed in the same direction as the bias magnetic field, the detection sensitivity may fluctuate.

It is an object of the invention to provide a current detector that prevents a fluctuation in the detection sensitivity even if a disturbance such as an external magnetic field is mixed in the direction of the bias magnetic field.

According to one embodiment of the invention, a current detector comprises:

a half-bridge configuration comprising first and second magnetic detection elements that are connected in series and disposed such that a magnetization direction of a magnetic pinned layer thereof is opposite to each other; and a bias magnetic field generating means for applying a bias magnetic field to the first and second magnetic detection elements, wherein the bias magnetic field has a substantially same intensity and is formed in a direction substantially orthogonal to the magnetization direction and opposite to each other.

According to another embodiment of the invention, a current detector comprises:

a full-bridge configuration comprising first to fourth magnetic detection elements, the first and second magnetic detection elements being connected in series and disposed such that a magnetization direction of a magnetic pinned layer thereof is opposite to each other, the third and fourth magnetic detection elements being connected in series and disposed such that a magnetization direction of a magnetic pinned layer thereof is opposite to each other, and the first and second magnetic detection elements being connected in parallel to the third and fourth magnetic detection elements; and a bias magnetic field generating means for applying a bias magnetic field to two arbitrarily selected from the first to fourth magnetic detection elements and to two remaining magnetic detection elements, wherein the bias magnetic field has a substantially same intensity and is formed in a direction substantially orthogonal to the magnetization direction and opposite to each other.

Effects of the Invention

According to one embodiment of the invention, a current detector can be provided that prevents a fluctuation in the detection sensitivity even if a disturbance such as an external magnetic field is mixed in the direction of the bias magnetic field.

BRIEF DESCRIPTION OF THE DRAWINGS

Next, the present invention will be explained in more detail in conjunction with appended drawings, wherein.

DETAILED DESCRIPTION OF THE PREFERRED EMBODIMENTS

First Embodiment

The first embodiment of the invention will be described below in reference to FIGS. 1A to 2B.

Figure 1A:
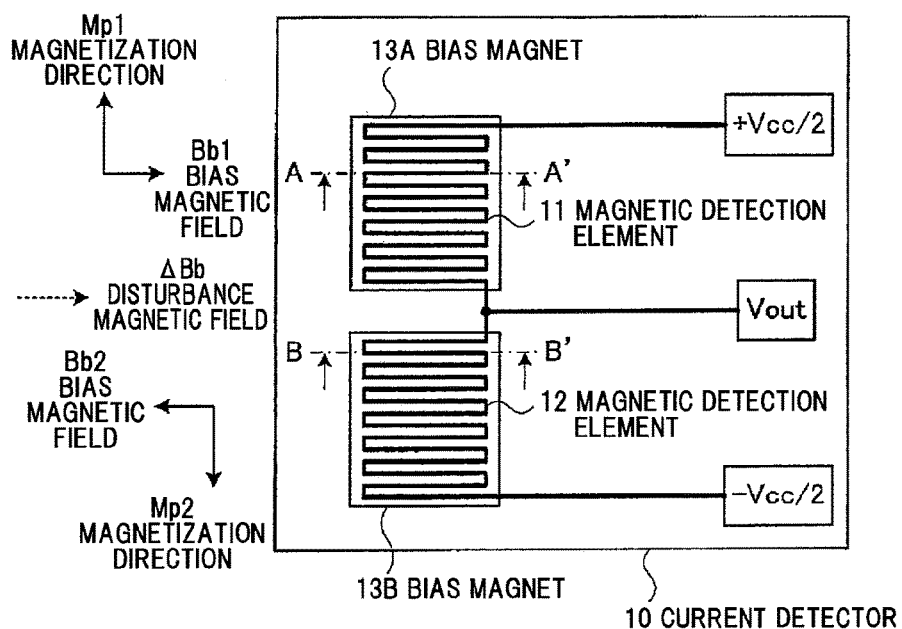
FIG. 1A is an illustration diagram schematically showing a current detector in a first embodiment according to the invention.
Figure 1B:
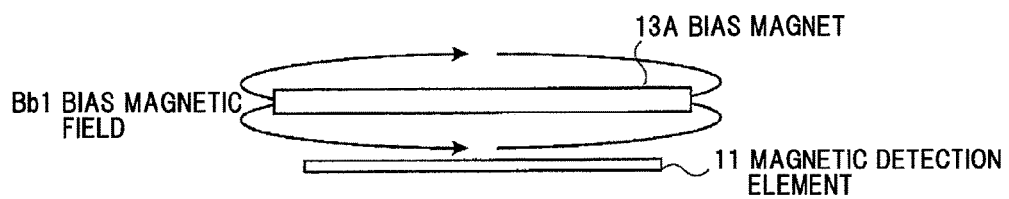
FIG. 1B is a cross sectional view taken along a line A-A' in FIG. 1A.
Figure 1C:
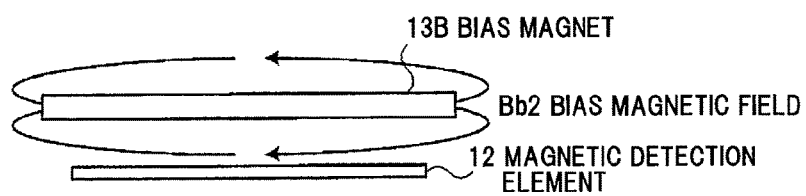
FIG. 1C is a cross sectional view taken along a line B-B' in FIG. 1A.
Figure 2A:
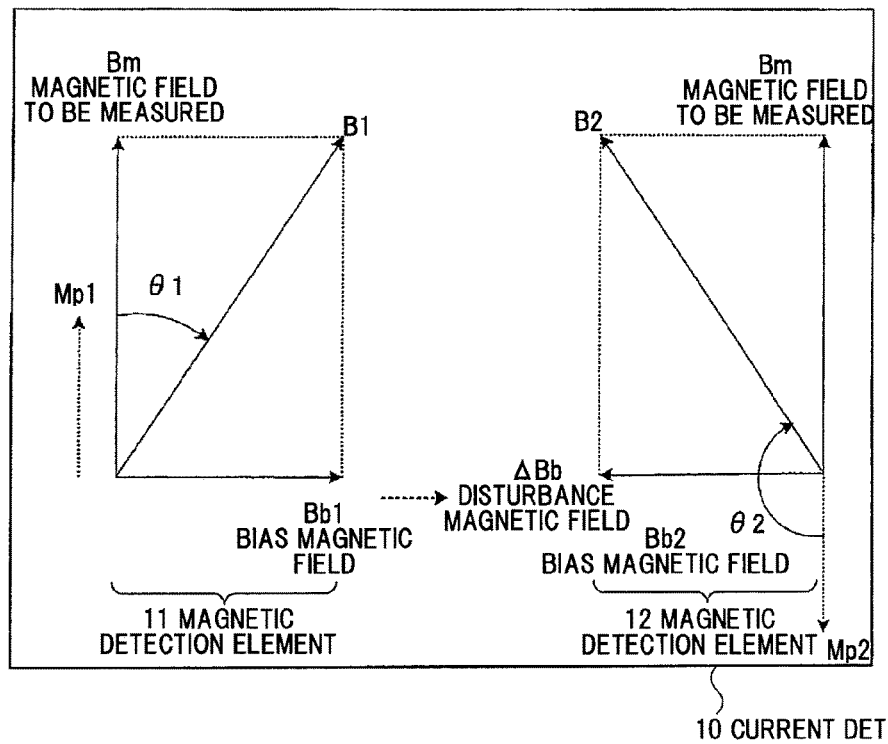
FIG. 2A is an illustration diagram representing a magnetic detection principle of magnetic detection elements used in the current detector in the first embodiment of the invention.
Figure 2B:
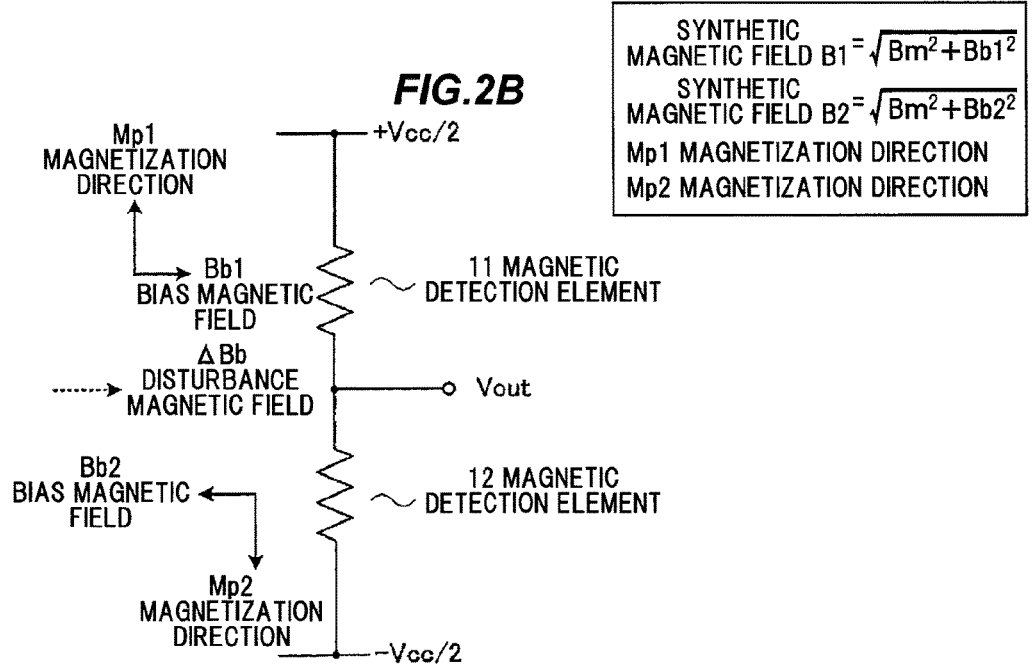
FIG. 2B is an illustration diagram representing a circuit configuration corresponding to the current detector in FIG. 1A.

FIG. 1A is an illustration diagram schematically showing a current detector in the first embodiment according to the invention. FIG. 1B is a cross sectional view taken along the line A-A' in FIG. 1A. FIG. 1C is a cross sectional view taken along the line B-B' in FIG. 1A. FIG. 2A is an illustration diagram representing the magnetic detection principle of magnetic detection elements used in the current detector in the first embodiment of the invention. FIG. 2B is an illustration diagram representing a circuit configuration corresponding to the current detector in FIG. 1A.

A current detector 10 includes magnetic detection elements 11 and 12 constructed from GMR elements formed on a substrate of silicone, etc., and bias magnets 13A and 13B. The magnetic detection elements 11 and 12 constituting the current detector 10 each have a meander shape arranged to alternately turn back several times at right and light edges, as shown in FIG. 1A.

Each of the magnetic detection elements 11 and 12 is formed by laminating a magnetic pinned layer, a magnetic free layer and a non-magnetic layer separating the magnetic pinned layer from the magnetic free layer. In the magnetic pinned layer, a magnetization direction Mp1 or Mp2 is fixed. In the magnetic free layer, a magnetization direction θ1 or θ2 changes depending on a bias magnetic field Bb1 or Bb2 applied in a direction substantially orthogonal to the magnetization direction Mp1 or Mp2 as well as on a magnetic field to be measured Bm. The magnetic field to be measured Bm is a magnetic field generated by a current to be measured, and the magnetization directions θ1 and θ2 are angles of the magnetization directions of the magnetic free layers with reference to the magnetization directions Mp1 and Mp2 of the magnetic pinned layers.

In FIG. 1A, the magnetization direction Mp1 of the magnetic pinned layer of the magnetic detection element 11 is upward and the bias magnetic field Bb1 is rightward. On the other hand, the magnetization direction Mp2 of the magnetic pinned layer of the magnetic detection element 12 is downward which is exactly opposite to the magnetization direction Mp1, and the bias magnetic field Bb2 is leftward which is exactly opposite to the bias magnetic field Bb1. In other words, the magnetic detection elements 11 and 12 are configured such that the magnetization directions Mp1 and Mp2 of the magnetic pinned layers are opposite to each other and the directions of the bias magnetic fields Bb1 and Bb2 are also opposite to each other.

FIGS. 1B and 1C show a relation of the magnetic detection elements 11 and 12 and the bias magnets 13A and 13B as bias magnetic field generating means. The bias magnets 13A and 13B are plate-shaped magnets formed above the magnetic detection elements 11 and 12 and generate the bias magnetic fields Bb1 and Bb2 as shown in the drawings. The bias magnets 13A and 13B each have a rectangular shape and respectively entirely cover the magnetic detection elements 11 and 12, as shown in FIG. 1A. The bias magnets 13A and 13B are formed of the same material in the same shape such that the bias magnetic fields Bb1 and Bb2 of the same intensity are supplied to the magnetic detection elements 11 and 12.

The bias magnets 13A and 13B are magnetized such that each of right and left end faces is a magnetic pole. The bias magnet 13A, in which the left end face is an N-pole and the right end face is an S-pole, generates the bias magnetic field Bb1 along a direction from the left end face (N-pole) toward the right end face (S-pole), as shown in FIG. 1B. On the other hand, the bias magnet 13B, in which the right end face is an N-pole and the left end face is an S-pole, generates the bias magnetic field Bb2 along a direction from the right end face (N-pole) toward the left end face (S-pole).

By the bias magnet 13A above the magnetic detection element 11, the rightward bias magnetic field Bb1 is applied to the magnetic detection element 11 located under the bias magnet 13A. On the other hand, by the bias magnet 13B above the magnetic detection element 12, the leftward bias magnetic field Bb2 is applied to the magnetic detection element 12 located under the bias magnet 13B. In other words, the bias magnetic fields Bb1 and Bb2, which are of the same intensity and are in opposite directions, are applied to the magnetic detection elements 11 and 12.

In FIG. 2A, relations among the magnetic field to be measured Bm applied to the magnetic detection elements 11 and 12, the magnetization directions Mp1 and Mp2 of the respective magnetic pinned layers, the bias magnetic fields Bb1 and Bb2 and synthetic magnetic fields B1 and B2 are shown as a magnetic detection principle of the magnetic detection elements 11 and 12.

In FIG. 2A, the applied direction of the magnetic field to be measured Bm is substantially parallel to the magnetization directions Mp1 and Mp2 of the magnetic pinned layers. The synthetic magnetic field B1/B2 is produced by combining the magnetic field to be measured Bm with the bias magnetic field Bb1/Bb2. The intensity of the synthetic magnetic field B1/B2 is expressed by the square root of the sum of a square of the magnetic field to be measured Bm and a square of the bias magnetic field Bb1 and Bb2, as shown in FIG. 2A. When the angles θ1 and θ2, which are respectively defined between the synthetic magnetic fields B1/B2 and the magnetization directions Mp1/Mp2 of the magnetic pinned layers, are smaller than 90°, current density distribution in a lamination direction of the magnetic pinned layer, the non-magnetic layer and the magnetic free layer is expanded accordingly, and also, a resistance value R drops. On the other hand, when the angles θ1 and θ2 are greater than 90°, the current density in the lamination direction of the magnetic pinned layer, the non-magnetic layer and the magnetic free layer is narrowed accordingly, and also, the resistance value R rises.

In the magnetic detection element 11 shown in FIG. 2A, the applied direction of the magnetic field to be measured Bm is in the same direction as the magnetization direction Mp1 and the angle θ1 is smaller than 90°. On the other hand, in the magnetic detection element 12 shown in FIG. 2A, the applied direction of the magnetic field to be measured Bm is opposite to the magnetization direction Mp2 and the angle θ2 is greater than 90°.

That is, the magnetization directions of the magnetic free layers rotate along with the directions of the synthetic magnetic fields B1/B2 produced by combining the magnetic field to be measured Bm with the bias magnetic fields Bb1/Bb2, and the resistance values R of the magnetic detection elements 11 and 12 vary according to the rotation of the magnetization directions of the magnetic free layers. In other words, the resistance values R of the magnetic detection elements 11 and 12 are determined according to the angles θ1 and θ2 defined between the synthetic magnetic fields B1/B2 and the magnetic field to be measured Bm.

As shown in FIG. 2B, a circuit configuration of the current detector 10 is a half-bridge configuration in which the magnetic detection elements 11 and 12 of the same structure are connected in series such that the magnetization directions Mp1 and Mp2 of the magnetic pinned layers are opposite to each other (about 180 degree-opposed directions) and, furthermore, the bias magnetic fields Bb1 and Bb2 are also opposite to each other (about 180 degree-opposed directions).

The magnetization direction Mp1 of the magnetic pinned layer of the magnetic detection element 11 is upward and the magnetization direction Mp2 of the magnetic pinned layer of the magnetic detection element 12 is downward which is exactly opposite thereto. Then, the bias magnetic field Bb1 applied to the magnetic free layer of the magnetic detection element 11 is rightward and the bias magnetic field Bb2 applied to the magnetic free layer of the magnetic detection element 12 is leftward which is exactly opposite thereto. Here, the directions pointed by arrows have nothing to do with the circuit configuration and are used for convenience to show that the magnetization directions of the magnetic pinned layers of the magnetic detection elements 11 and 12 are opposite to each other.

In the current detector 10, a power-supply voltage +Vcc/2 (e.g., about 2.5V) is applied to a first electrode of the magnetic detection element 11 and a power-supply voltage −Vcc/2 (e.g., about −2.5V) is applied to a second electrode of the magnetic detection element 12. Output voltage signals Vout are output from a second electrode of the magnetic detection element 11 and a first electrode of the magnetic detection element 12 which form a junction between the magnetic detection elements 11 and 12.

In this configuration, the magnetoresistance change rate is substantially the same in the magnetic detection element 11 and in the magnetic detection element 12. Since the magnetoresistance change rate is determined by configuration and composition of GMR, the magnetic detection elements 11 and 12 are formed to have substantially the same configuration and composition.

Such a configuration allows the influence of a disturbance magnetic field on the output voltage signals to be reduced. When the intensity of the disturbance magnetic field is, e.g., about 1% of the bias magnetic field, output voltage signal regulation which could be about 0.54% is improved to 0.0036% in the present embodiment. Meanwhile, when the intensity of the disturbance magnetic field is about 10% of the bias magnetic field, output voltage signal regulation which could be about 5.2% is improved to 0.36%. Furthermore, when the intensity of the disturbance magnetic field is about 50% of the bias magnetic field, output voltage signal regulation which could be about 22% is improved to 9.9%.

Functions and Effects of the First Embodiment

When a disturbance magnetic field ΔBb indicated by a dot-line arrow in FIG. 1A is applied in a direction parallel to the directions of the bias magnetic fields Bb1 and Bb2 which are applied to the magnetic detection elements 11 and 12 as shown in FIG. 1A, each of the bias magnetic fields Bb1 and Bb2 applied to the magnetic detection elements 11 and 12 varies and the resistance in each of the magnetic detection elements 11 and 12 changes from the state without the disturbance magnetic field ΔBb. This corresponds to change in sensitivity of the magnetic detection elements 11 and 12. However, since the bias magnetic fields Bb1 and Bb2 applied to the magnetic detection elements 11 and 12 are of the same intensity but in opposite directions, the influence of the disturbance magnetic field ΔBb is cancelled out and the change in sensitivity is thus suppressed even when the disturbance magnetic field ΔBb is present.

By configuring the magnetic detection elements 11 and 12 to have the same magnetoresistance change rate and by applying the power-supply voltage +Vcc/2 to the first electrode of the magnetic detection element 11 and the power-supply voltage −Vcc/2 to the second electrode of the magnetic detection element 12, i.e., respectively applying the positive and negative voltages of the same intensity to the magnetic detection elements 11 and 12, it is possible to drastically improve the effect of suppressing the change in sensitivity in the state that the disturbance magnetic field ΔBb is present.

Due to the configuration in which the magnetoresistance change rate is the same in the magnetic detection element 11 and in the magnetic detection element 12, it is possible to suppress the change in detection sensitivity even when a disturbance such as external magnetic field is mixed.

Second Embodiment

Figure 3A:
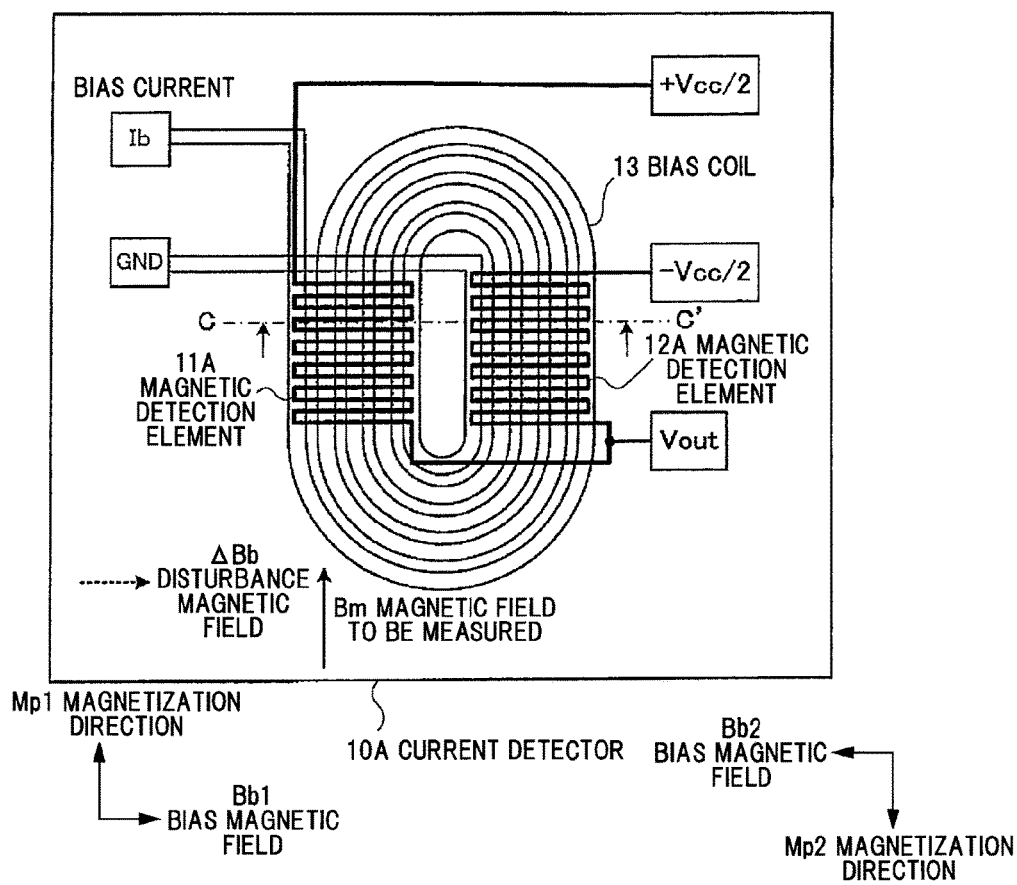
FIG. 3A is an illustration diagram schematically showing a current detector in a second embodiment according to the invention.
Figure 3B:
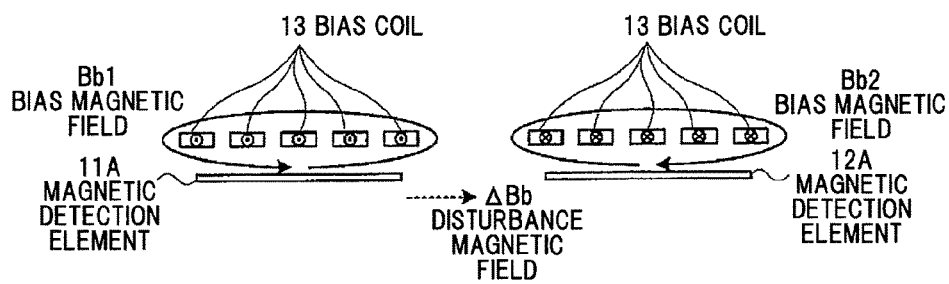
FIG. 3B is a cross sectional view taken along a line C-C' in FIG. 3A.

Next, the second embodiment of the invention will be described in reference to FIGS. 3A and 3B. FIG. 3A is an illustration diagram schematically showing a current detector in the second embodiment according to the invention and corresponds to FIG. 1A. FIG. 3B is a cross sectional view taken along the line C-C' in FIG. 3A. In the second embodiment, a bias coil 13 for supplying bias magnetic fields to magnetic detection elements 11A and 12A is provided in place of the bias magnets 13A and 13B of FIG. 1A and the remaining configuration is the same as the first embodiment. The following description focuses on the configuration of the bias coil 13 which is a point of difference, and the same constituent elements as those described in the first embodiment will be denoted by the same reference numerals and the explanation thereof will be omitted.

A current detector 10A includes the magnetic detection elements 11A and 12A constructed from GMR elements formed on a substrate of silicone, etc., in the same manner as the first embodiment, and the bias coil 13. The magnetic detection elements 11A and 12A constituting the current detector 10A each have a meander shape arranged to alternately turn back several times at right and light edges in the same manner as that shown in FIG. 1A.

In FIG. 3A, the magnetization direction Mp1 of the magnetic pinned layer of the magnetic detection element 11A is upward and the bias magnetic field Bb1 is rightward. On the other hand, the magnetization direction Mp2 of the magnetic pinned layer of the magnetic detection element 12A is downward which is exactly opposite to the magnetization direction Mp1, and the bias magnetic field Bb2 is leftward which is exactly opposite to the bias magnetic field Bb1. In other words, the magnetic detection elements 11A and 12A are configured such that the magnetization directions Mp1 and Mp2 of the magnetic pinned layers are opposite to each other and the directions of the bias magnetic fields Bb1 and Bb2 are also opposite to each other.

The bias magnetic fields Bb1 and Bb2 are generated by the bias coil 13 formed above the magnetic detection elements 11A and 12A. The bias coil 13 is formed by the same thin film process as for manufacturing the magnetic detection elements 11A and 12A. The bias coil 13 is connected, at one end, to a bias terminal and is connected, at the other end, to an earth terminal GND, and a bias current Ib of, e.g., about 10 mA for generating a bias magnetic field is supplied to the bias coil 13 from a bias current source (not shown).

The bias current Ib as is illustrated in FIG. 3B flows through the bias coil 13. That is, the bias current Ib passing through the bias coil 13 above the magnetic detection element 11A flows toward the front side of the paper. This generates the counterclockwise magnetic field Bb1 around the bias coil 13 and the rightward bias magnetic field Bb1 is thus applied to the magnetic detection element 11A. On the other hand, the bias current Ib passing through the bias coil 13 above the magnetic detection element 12A flows toward the back side of the paper. This generates the clockwise magnetic field Bb2 around the bias coil 13 and the leftward bias magnetic field Bb2 is thus applied to the magnetic detection element 12A.

The relations among the magnetic field to be measured Bm applied to the magnetic detection elements 11A and 12A, the magnetization directions Mp1 and Mp2 of the respective magnetic pinned layers, the bias magnetic fields Bb1 and Bb2 and the synthetic magnetic fields B1 and B2 are the same as that shown in FIG. 2A. The circuit configuration of the current detector 10A composed of the magnetic detection elements 11A and 12A is also the same as that shown in FIG. 2A.

Functions and Effects of the Second Embodiment

The second embodiment achieves the same functions and effects as those described for the first embodiment.

In the first embodiment, the bias magnetic fields Bb1 and Bb2 in the opposite directions are generated by two bias magnets 13A and 13B. Meanwhile; in the second embodiment, since the bias magnetic fields Bb1 and Bb2 in the opposite directions are supplied to the magnetic detection elements 11A and 12A by arranging the magnetic detection elements 11A and 12A on both sides of one bias coil 13, the magnetic detection elements 11A and 12A arranged in parallel allows the size of the elements as a whole to be reduced.

Figure 4:
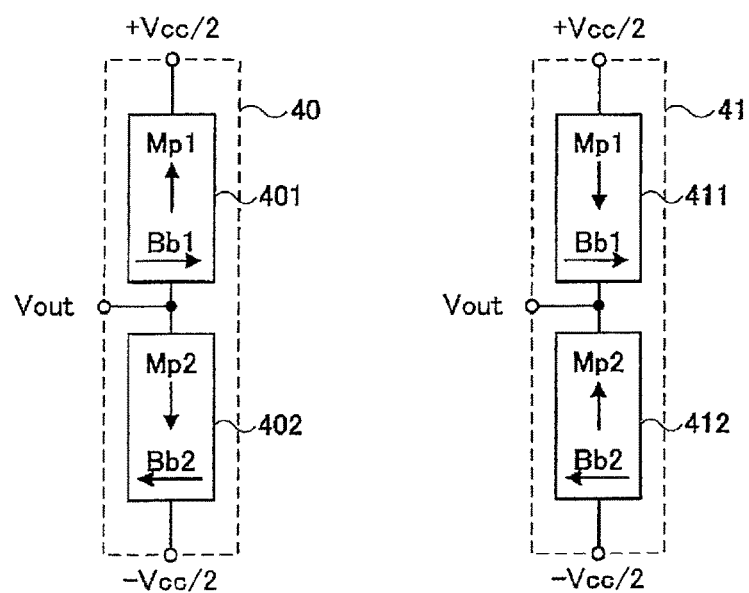
FIG. 4 is illustration diagrams each representing a combination of a magnetization direction of a magnetic pinned layer and a bias magnetic field applied thereto in each of magnetic detection elements of the current detector with series-connected half-bridge configuration.
Figure 4:
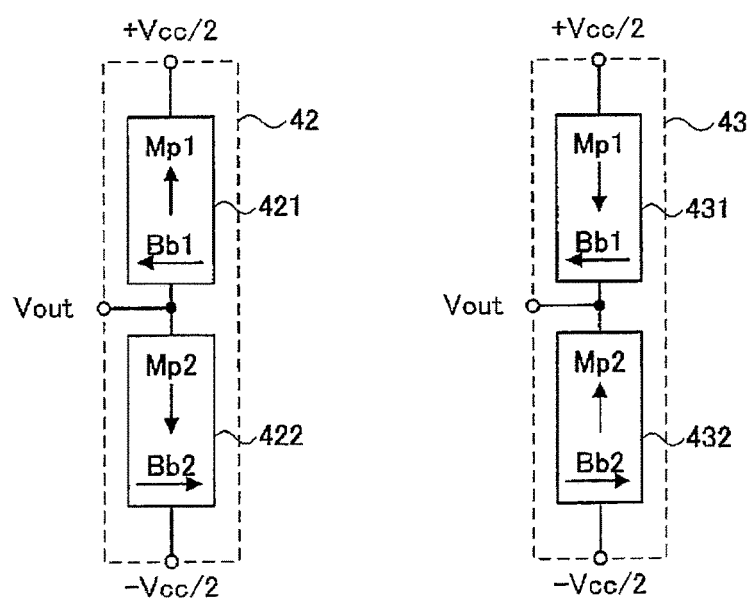

FIG. 4 is illustration diagrams each representing a combination of the magnetization directions Mp1 and Mp2 of the magnetic pinned layer and the bias magnetic fields Bb1 and Bb2 applied thereto in each of the magnetic detection elements of the current detector with series-connected half-bridge configuration.

A current detector 40 in FIG. 4 has a series-connected half-bridge configuration composed of magnetic detection elements 401 and 402 and corresponds to the current detector 10 in FIG. 1A as well as the current detector 10A in FIG. 3A. The magnetic detection element 401 corresponds to the magnetic detection element 11 in FIG. 1A as well as the magnetic detection element 11A in FIG. 3A, and the magnetic detection element 402 corresponds to the magnetic detection element 12 in FIG. 1A as well as the magnetic detection element 12A in FIG. 3A.

In the same manner as the magnetic detection element 11 in FIG. 1A and the magnetic detection element 11A in FIG. 3A, the magnetization direction Mp1 of the magnetic pinned layer of the magnetic detection element 401 is upward and the bias magnetic field Bb1 is rightward. In the same manner as the magnetic detection element 12 in FIG. 1A and the magnetic detection element 12A in FIG. 3A, the magnetization direction Mp2 of the magnetic pinned layer of the magnetic detection element 402 is downward which is exactly opposite to the magnetization direction Mp1, and the bias magnetic field Bb2 is leftward which is exactly opposite to the bias magnetic field Bb1.

A current detector 41 in FIG. 4 has a series-connected half-bridge configuration composed of magnetic detection elements 411 and 412. The magnetization direction Mp1 of the magnetic pinned layer of the magnetic detection element 411 is downward and the bias magnetic field Bb1 is rightward. The magnetization direction Mp2 of the magnetic pinned layer of the magnetic detection element 412 is upward which is exactly opposite to the magnetization direction Mp1, and the bias magnetic field Bb2 is leftward which is exactly opposite to the bias magnetic field Bb1.

The current detector 41 corresponds to the configuration obtained by reversing the positions of the magnetic detection elements 11 and 12 in FIG. 1A. The current detector 41 also corresponds to the configuration obtained by reversing the positions of the magnetic detection elements 11A and 12A in FIG. 3A.

A current detector 42 in FIG. 4 has a series-connected half-bridge configuration composed of magnetic detection elements 421 and 422. The magnetization direction Mp1 of the magnetic pinned layer of the magnetic detection element 421 is upward and the bias magnetic field Bb1 is leftward. The magnetization direction Mp2 of the magnetic pinned layer of the magnetic detection element 422 is downward which is exactly opposite to the magnetization direction Mp1, and the bias magnetic field Bb2 is rightward which is exactly opposite to the bias magnetic field Bb1.

The current detector 42 corresponds to the configuration obtained by reversing the positions of the bias magnets 13A and 13B in FIG. 1A. The current detector 42 also corresponds to the configuration obtained by reversing the direction of the bias current Ib flowing through the bias coil 13 in FIG. 3A.

A current detector 43 in FIG. 4 has a series-connected half-bridge configuration composed of magnetic detection elements 431 and 432. The magnetization direction Mp1 of the magnetic pinned layer of the magnetic detection element 431 is downward and the bias magnetic field Bb1 is leftward. The magnetization direction Mp2 of the magnetic pinned layer of the magnetic detection element 432 is upward which is exactly opposite to the magnetization direction Mp1, and the bias magnetic field Bb2 is rightward which is exactly opposite to the bias magnetic field Bb1.

The current detector 43 corresponds to the configuration obtained by reversing the positions of the magnetic detection element 11/the bias magnet 13A and the magnetic detection element 12/the bias magnet 13B in FIG. 1A. The current detector 43 also corresponds to the configuration obtained by reversing the positions of the magnetic detection elements 11A and 12A as well as reversing the direction of the bias current Ib flowing through the bias coil 13 in FIG. 3A.

Each of the current detectors 40 to 43 is configured such that the magnetization directions of the magnetic pinned layers of the magnetic detection elements in a series-connected half-bridge configuration are of the same intensity and in opposite directions and also the bias magnetic fields are of the same intensity and in opposite directions.

Third Embodiment

Figure 5:
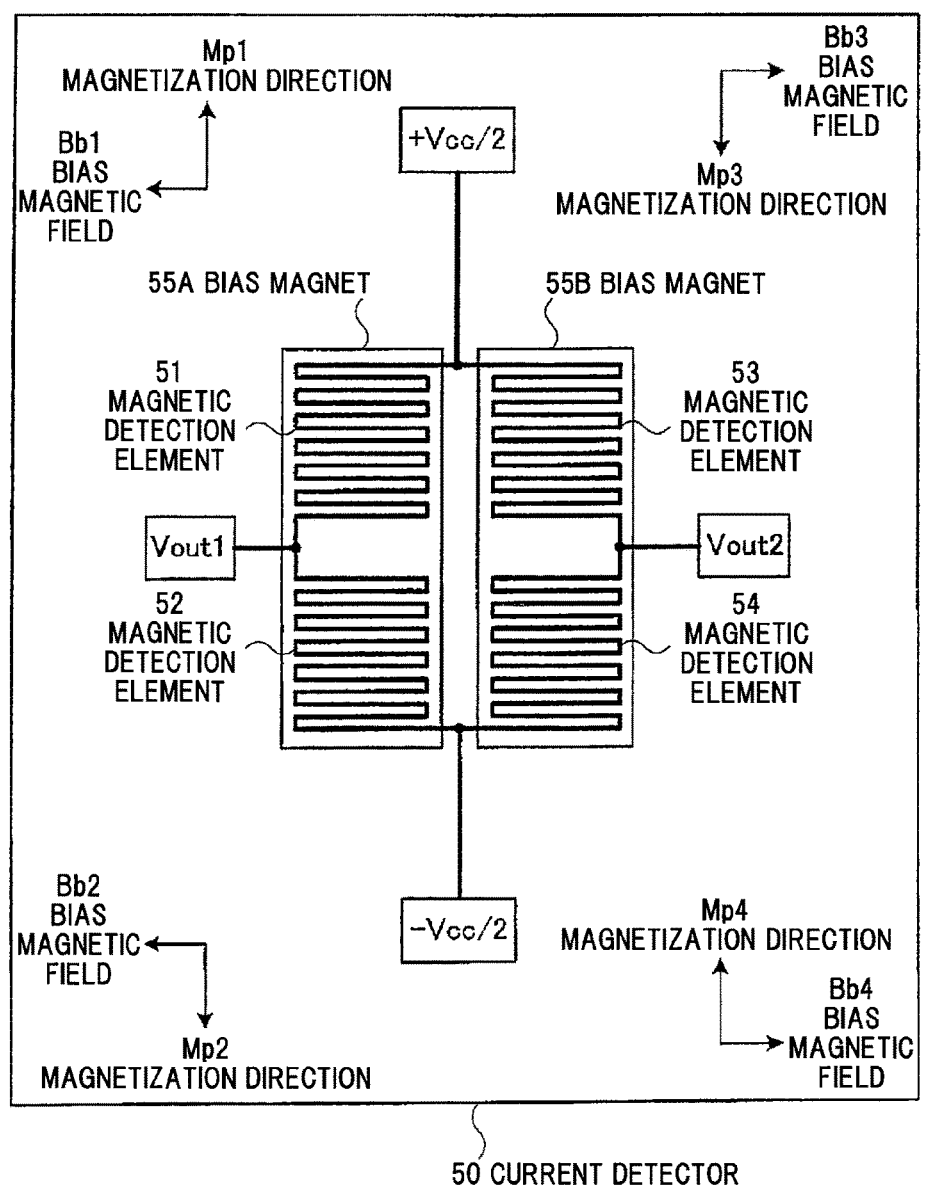
FIG. 5 is an illustration diagram schematically showing a current detector in a third embodiment according to the invention.

Next, the third embodiment of the invention will be described in reference to FIG. 5. FIG. 5 is an illustration diagram schematically showing a current detector in the third embodiment according to the invention and corresponds to FIG. 1A. In the third embodiment, a current detector 50 has a full-bridge configuration composed of four magnetic detection elements 51 to 54 each of which has the same configuration as that in the first embodiment.

The magnetic detection elements 51 and 52 are connected in series and the magnetic detection elements 53 and 54 are connected in series. A junction between the series-connected magnetic detection elements 51 and 52 is connected in parallel to that between the magnetic detection elements 53 and 54. Such a connection structure with the four magnetic detection elements 51 to 54 is called "full-bridge configuration".

A bias magnet 55A having a plate shape is formed above the magnetic detection elements 51 and 52 and a bias magnet 55B also having a plate shape is formed above the magnetic detection elements 53 and 54. The bias magnet 55A has a rectangular shape entirely covering the magnetic detection elements 51 and 52 as shown in FIG. 5, and the bias magnet 55B has a rectangular shape entirely covering the magnetic detection elements 53 and 54 as shown in FIG. 5. Bias magnetic fields Bb1 and Bb1 of the same intensity and in the same direction are respectively supplied to the magnetic detection elements 51 and 52 by the bias magnet 55A. Bias magnetic fields Bb3 and Bb4 of the same intensity and in the same direction are respectively supplied to the magnetic detection elements 53 and 54 by the bias magnet 55B.

In the current detector 50 with full-bride configuration composed of the four magnetic detection elements 51 to 54, the power-supply voltage +Vcc/2 (e.g., about 2.5V) is applied to first electrodes of the magnetic detection elements 51 and 53 and the power-supply voltage −Vcc/2 (e.g., about −2.5V) is applied to second electrodes of the magnetic detection elements 52 and 54. Output voltage signals Vout1 are output from a second electrode of the magnetic detection element 51 and a first electrode of the magnetic detection element 52 which form a junction between the magnetic detection elements 51 and 52, while output voltage signals Vout2 are output from a second electrode of the magnetic detection element 53 and a first electrode of the magnetic detection element 54 which form a junction between the magnetic detection elements 53 and 54. The output of the entire full-bridge configuration is output as Vout which is an output difference between the output voltage signal Vout1 and the output voltage signal Vout2. To supply power, a power-supply voltage +Vcc (e.g., about 5.0V) may be applied to the first electrode in a state that the second electrode is connected to an earth terminal. In this case, by configuring the magnetic detection elements 52 and 54 on the earth terminal side to have the same magnetoresistance change rate, it is possible to suppress the change in detection sensitivity even when a disturbance such as external magnetic field is mixed.

In FIG. 5, the magnetization direction Mp1 of the magnetic pinned layer of the magnetic detection element 51 is upward and the bias magnetic field Bb1 is leftward. The magnetization direction Mp2 of the magnetic pinned layer of the magnetic detection element 52 is downward which is exactly opposite to the magnetization direction Mp1, and the bias magnetic field Bb2 is leftward which is in the same direction as the bias magnetic field Bb1. In other words, the magnetic detection elements 51 and 52 are configured such that the magnetization directions Mp1 and Mp2 of the magnetic pinned layers are opposite to each other and the bias magnetic fields Bb1 and Bb2 are of the same intensity and in the same direction.

Meanwhile, in FIG. 5, the magnetization direction Mp3 of the magnetic pinned layer of the magnetic detection element 53 is downward and the bias magnetic field Bb3 is rightward. The magnetization direction Mp4 of the magnetic pinned layer of the magnetic detection element 54 is upward which is exactly opposite to the magnetization direction Mp3, and the bias magnetic field Bb4 is rightward which is in the same direction as the bias magnetic field Bb3. In other words, the magnetic detection elements 53 and 54 are configured such that the magnetization directions Mp3 and Mp4 of the magnetic pinned layers are opposite to each other and the directions of the bias magnetic fields Bb3 and Bb4 are the same.

That is, in the current detector 50 with full-bride configuration composed of the four magnetic detection elements 51 to 54, the relation between the magnetic detection elements 51 and 52 connected in series and between the magnetic detection elements 53 and 54 connected in series is such that the magnetization directions of the respective magnetic pinned layers are opposite to each other, and the relation between the two magnetic detection elements 51 and 54 and between the two magnetic detection elements 52 and 53 is such that the directions of the bias magnetic fields are opposite to each other. Thus, the output voltage signal Vout1 changes (e.g., decreases as an absolute value) since sensitivity of the half-bridge configuration composed of the magnetic detection elements 51 and 52 connected in series changes (e.g., decreases) due to the disturbance magnetic field ΔBb while, conversely, the output voltage signal Vout2 changes (e.g., increases as an absolute value) since sensitivity of the half-bridge configuration composed of the magnetic detection elements 53 and 54 connected in series changes (e.g., increases) in the opposite direction due to the disturbance magnetic field ΔBb. In the entire full-bridge configuration, the influence of the disturbance magnetic field ΔBb on the output voltage signal Vout is cancelled out as a result and the change in sensitivity is thus suppressed even when the disturbance magnetic field ΔBb is present.

Figure 6:
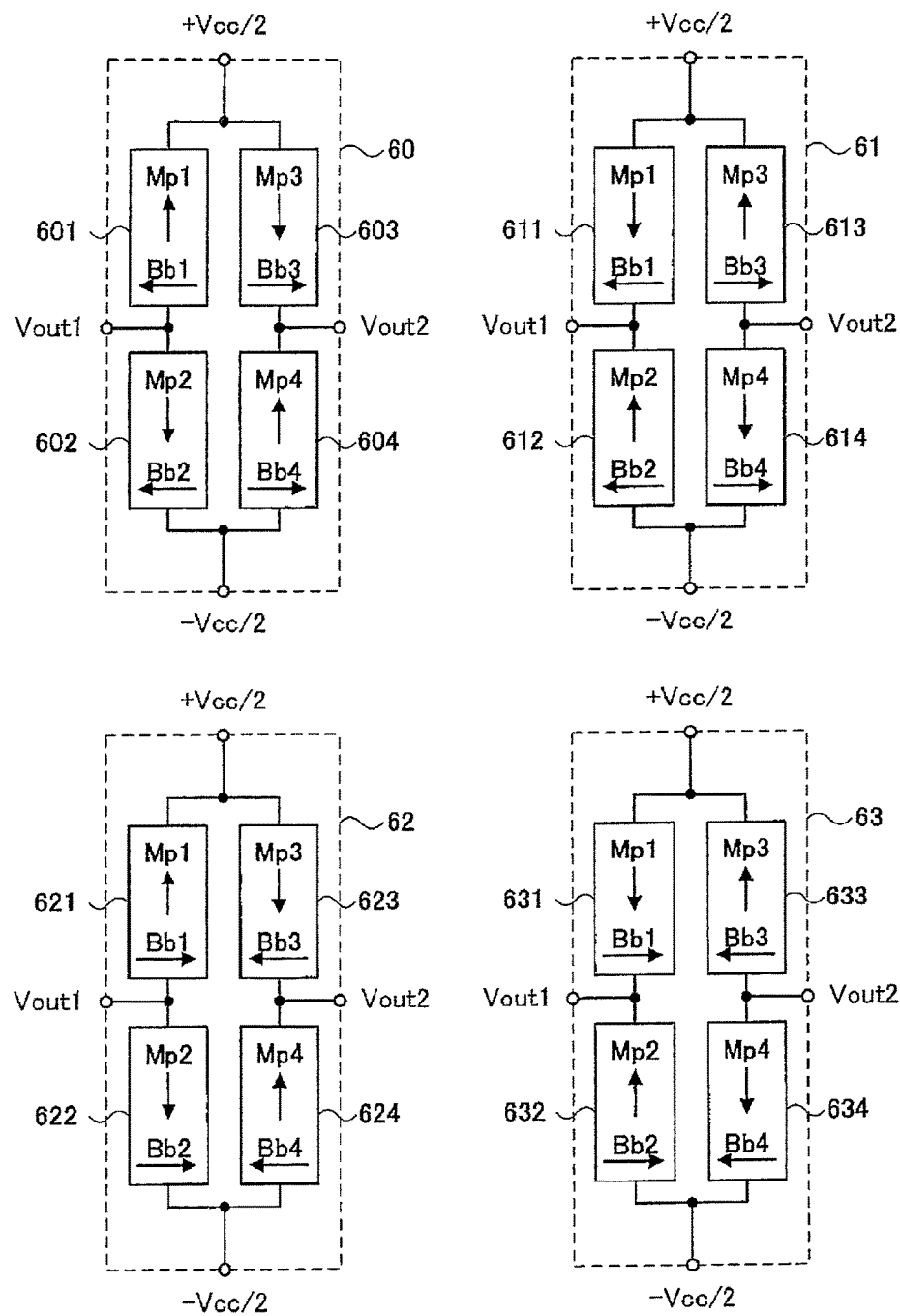
FIG. 6 is illustration diagrams representing a first combination group of a magnetization direction of a magnetic pinned layer and a bias magnetic field applied thereto in each of magnetic detection elements so as to realize the same function as the current detector with a full-bridge configuration in FIG. 5.
Figure 7:
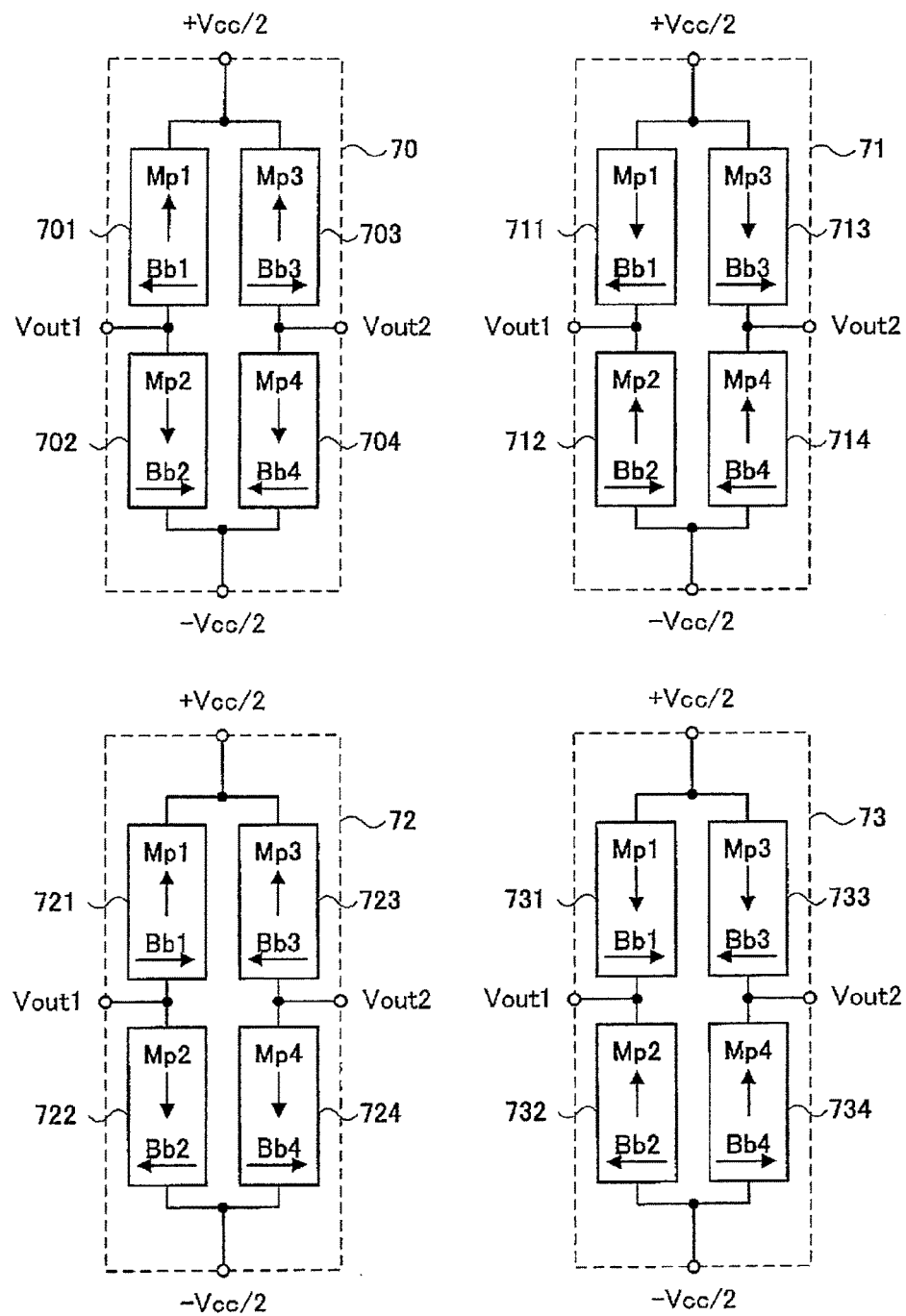
FIG. 7 is illustration diagrams representing a second combination group of a magnetization direction of a magnetic pinned layer and a bias magnetic field applied thereto in each of magnetic detection elements so as to realize the same function as the current detector with the full-bridge configuration in FIG. 5.

FIG. 6 and FIG. 7 are each illustration diagrams representing a first combination group and a second combination group, respectively, of the magnetization directions Mp1 to Mp4 of the magnetic pinned layers and the bias magnetic fields Bb1 to Bb4 applied thereto in each of the magnetic detection elements so as to realize the same function as the current detector with full-bridge configuration in FIG. 5.

A current detector 60 in FIG. 6 has a full-bridge configuration in which a junction between series-connected magnetic detection elements 601 and 602 is connected in parallel to that between magnetic detection elements 603 and 604, and corresponds to the current detector 50 in FIG. 5. The magnetic detection element 601 corresponds to the magnetic detection element 51 in FIG. 5, the magnetic detection element 602 to the magnetic detection element 52 in FIG. 5, the magnetic detection element 603 to the magnetic detection element 53 in FIG. 5 and the magnetic detection element 604 to the magnetic detection element 54 in FIG. 5.

In the same manner as the magnetic detection element 51 in FIG. 5, the magnetization direction Mp1 of the magnetic pinned layer of the magnetic detection element 601 is upward and the bias magnetic field Bb1 is leftward. In the same manner as the magnetic detection element 52 in FIG. 5, the magnetization direction Mp2 of the magnetic pinned layer of the magnetic detection element 602 is downward which is exactly opposite to the magnetization direction Mp1, and the bias magnetic field Bb2 is leftward which is in the same direction as the bias magnetic field Bb1. In the same manner as the magnetic detection element 53 in FIG. 5, the magnetization direction Mp3 of the magnetic pinned layer of the magnetic detection element 603 is downward and the bias magnetic field Bb3 is rightward which is exactly opposite to the bias magnetic field Bb2. In the same manner as the magnetic detection element 54 in FIG. 5, the magnetization direction Mp4 of the magnetic pinned layer of the magnetic detection element 604 is upward which is exactly opposite to the magnetization direction Mp3, and the bias magnetic field Bb4 is rightward which is exactly opposite to the bias magnetic field Bb1.

A current detector 61 in FIG. 6 has a full-bridge configuration in which a junction between series-connected magnetic detection elements 611 and 612 is connected in parallel to that between magnetic detection elements 613 and 614. In the current detector 61, the magnetization directions Mp1 to Mp4 of the magnetic pinned layers of the magnetic detection elements 611 to 614 are opposite to those of the respective corresponding magnetic detection elements 601 to 604 of the current detector 60.

A current detector 62 in FIG. 6 has a full-bridge configuration in which a junction between series-connected magnetic detection elements 621 and 622 is connected in parallel to that between magnetic detection elements 623 and 624. In the current detector 62, the directions of the bias magnetic fields Bb1 to Bb4 applied to the magnetic detection elements 621 to 624 are opposite to those applied to the respective corresponding magnetic detection elements 601 to 604 of the current detector 60.

A current detector 63 in FIG. 6 has a full-bridge configuration in which a junction between series-connected magnetic detection elements 631 and 632 is connected in parallel to that between magnetic detection elements 633 and 634. In the current detector 63, the magnetization directions Mp1 to Mp4 of the magnetic pinned layers of the magnetic detection elements 631 to 634 and the directions of the bias magnetic fields Bb1 to Bb4 are respectively opposite to the respective corresponding magnetic detection elements 601 to 604 of the current detector 60.

A current detector 70 in FIG. 7 has a full-bridge configuration in which a junction between series-connected magnetic detection elements 701 and 702 is connected in parallel to that between magnetic detection elements 703 and 704. In the current detector 70, the magnetization directions Mp3 and Mp4 of the magnetic pinned layers of the magnetic detection elements 703 to 704 are opposite to those of the respective corresponding magnetic detection elements 603 and 604 of the current detector 60 and the directions of the bias magnetic fields Bb2 and Bb4 applied to the magnetic detection elements 702 to 704 are opposite to those applied to the respective corresponding magnetic detection elements 602 and 604 of the current detector 60.

A current detector 71 in FIG. 7 has a full-bridge configuration in which a junction between series-connected magnetic detection elements 711 and 712 is connected in parallel to that between magnetic detection elements 713 and 714. In the current detector 71, the magnetization directions Mp1 and Mp2 of the magnetic pinned layers of the magnetic detection elements 711 to 712 are opposite to those of the respective corresponding magnetic detection elements 601 and 602 of the current detector 60 and the directions of the bias magnetic fields Bb2 and Bb4 applied to the magnetic detection elements 712 to 714 are opposite to those applied to the respective corresponding magnetic detection elements 602 and 604 of the current detector 60.

A current detector 72 in FIG. 7 has a full-bridge configuration in which a junction between series-connected magnetic detection elements 721 and 722 is connected in parallel to that between magnetic detection elements 723 and 724. In the current detector 72, the magnetization directions Mp3 and Mp4 of the magnetic pinned layers of the magnetic detection elements 723 to 724 are opposite to those of the respective corresponding magnetic detection elements 603 and 604 of the current detector 60 and the directions of the bias magnetic fields Bb1 and Bb3 applied to the magnetic detection elements 721 to 723 are opposite to those applied to the respective corresponding magnetic detection elements 601 and 603 of the current detector 60.

A current detector 73 in FIG. 7 has a full-bridge configuration in which a junction between series-connected magnetic detection elements 731 and 732 is connected in parallel to that between magnetic detection elements 733 and 734. In the current detector 73, the magnetization directions Mp1 and Mp2 of the magnetic pinned layers of the magnetic detection elements 731 to 732 are opposite to those of the respective corresponding magnetic detection elements 601 and 602 of the current detector 60 and the directions of the bias magnetic fields Bb1 and Bb3 applied to the magnetic detection elements 731 to 733 are opposite to those applied to the respective corresponding magnetic detection elements 601 and 603 of the current detector 60.

The current detectors 60 to 63 and 70 to 73 are configured that the bias magnetic fields applied to any two of the four magnetic detection elements in the full-bridge configuration and those applied to the remaining two magnetic detection elements are respectively of the same intensitys and in the opposite directions.

Functions and Effects of the Third Embodiment

The third embodiment achieves the same functions and effects as those described for the first and second embodiments.

Although the bias magnets 55A and 55B have been described as an example of the bias magnetic field generating means in the third embodiment, a bias coil formed by the same thin film process as for manufacturing the magnetic detection elements may be provided above the magnetic detection elements in the same manner as the second embodiment. Also in this case, arranging four magnetic detection elements under one bias coil allows the size of the elements as a whole to be reduced.

SUMMARY OF THE EMBODIMENTS

Technical ideas understood from the embodiments will be described below citing the reference numerals, etc., used for the embodiments. However, each reference numeral described below is not intended to limit the constituent elements in the claims to the members, etc., specifically described in the embodiments.

[1] A current detector (10, 10A, 40, 41, 42, 43), comprising: a half-bridge configuration comprising first and second magnetic detection elements (11/12, 11A/12A, 401/402, 411/412, 421/422, 431/432) connected in series such that magnetization directions (Mp1, Mp2) of respective magnetic pinned layers are opposite; and a bias magnetic field generating means (13, 13A/13B) for applying bias magnetic fields (Bb1, Bb2) of substantially the same intensity and in opposite directions to the first and second magnetic detection elements (11/12, 11A/12A), the bias magnetic fields (Bb1, Bb2) being along directions substantially orthogonal to the magnetization directions (Mp1, Mp2).

In this aspect, by configuring a current detector with series-connected half-bridge configuration such that the magnetization directions (Mp1, Mp2) of the magnetic pinned layers are in opposite directions and the bias magnetic fields (Bb1, Bb2) are of the same intensity and in opposite directions, the influence of the disturbance magnetic field ΔBb is cancelled out, thereby allowing the change in sensitivity to be suppressed even when the disturbance magnetic field ΔBb is present.

[2] The current detector (10, 10A, 40, 41, 42, 43) defined in [1], wherein positive and negative voltages (±Vcc/2) of substantially the same intensity are respectively applied to the first and second magnetic detection elements (11/12, 11A/12A, 401/402, 411/412, 421/422, 431/432).

In this aspect, the positive and negative voltages (±Vcc/2) of the same intensity are applied to the current detector with half-bridge configuration to drastically improve the effect of suppressing the change in sensitivity in case that the disturbance magnetic field ΔBb is present. The positive and negative voltages are preferably of the same intensity but a difference of up to about +10% is acceptable.

[3] The current detector (10, 10A, 40, 41, 42, 43) defined in [1] or [2], wherein the first and second magnetic detection elements (11/12, 11A/12A, 401/402, 411/412, 421/422, 431/432) have the same magnetoresistance change rate.

In this aspect, the change in sensitivity of the current detector is suppressed by equalizing the magnetoresistance change rate.

[4] The current detector (10, 10A, 40, 41, 42, 43) defined in [1], [2] or [3], wherein the bias magnetic field generating means (13A/13B) comprises a first bias magnet (13A) provided above the first magnetic detection element (11, 11A) on a substrate and a second bias magnet (13B) provided above the second magnetic detection element (12, 12A) on the substrate.

In this aspect, the magnets are used as the bias magnetic field generating means.

[5] The current detector (10, 10A, 40, 41, 42, 43) defined in [1], [2] or [3], wherein the bias magnetic field generating means (13) comprises one bias coil (13) provided above the first and second magnetic detection elements on the substrate.

In this aspect, the bias coil is used as the bias magnetic field generating means. Since the bias magnetic fields in the opposite directions can be supplied to the magnetic detection elements by arranging the magnetic detection elements on both sides of one bias coil, it is possible to reduce the size of the elements as a whole.

[6] A current detector (50, 60, 61, 62, 63, 70, 71, 72, 73), comprising: a full-bridge configuration comprising first to fourth magnetic detection elements, the first and second magnetic detection elements (51/52, 601/602, 611/612, 621/622, 631/632, 701/702, 711/712, 721/722, 731/732) being connected in series such that magnetization directions (Mp1, Mp2) of respective magnetic pinned layers are opposite, the third and fourth magnetic detection elements (53/54, 603/604, 613/614, 623/624, 633/634, 703/704, 713/714, 723/724, 733/734) being connected in series such that magnetization directions (Mp3, Mp4) of respective magnetic pinned layers are opposite, and the first and second magnetic detection elements (51/52, 601/602, 611/612, 621/622, 631/632, 701/702, 711/712, 721/722, 731/732) being connected in parallel to the third and fourth magnetic detection elements (53/54, 603/604, 613/614, 623/624, 633/634, 703/704, 713/714, 723/724, 733/734); and a bias magnetic field generating means (55A/55B) for applying bias magnetic fields (Bb1, Bb2, Bb3, Bb4) of substantially the same intensity and in opposite directions to any two selected from the first to fourth magnetic detection elements (51/52/53/54, 601/602/603/604, 611/612/613/614, 621/622/623/624, 631/632/633/634, 701/702/703/704, 711/712/713/714, 721/722/723/724, 731/732/733/734) and to two remaining magnetic detection elements, the bias magnetic fields (Bb1, Bb2, Bb3, Bb4) being along directions substantially orthogonal to the magnetization directions (Mp1, Mp2, Mp3, Mp4).

In this aspect, the current detectors with series-connected half-bridge configuration are connected in parallel to form a current detector with full-bridge configuration, and furthermore, by configuring the current detector with full-bridge configuration such that the magnetization directions of the magnetic pinned layers of the series-connected magnetic detection elements are in opposite directions and the bias magnetic fields applied to two of the four magnetic detection elements in the full-bridge configuration and those applied to the remaining two magnetic detection elements are respectively of the same intensitys and in opposite directions, the influence of the disturbance magnetic field ΔBb is cancelled out, thereby allowing the change in sensitivity to be suppressed even when the disturbance magnetic field ΔBb is present.

[7] The current detector (50, 60, 61, 62, 63, 70, 71, 72, 73) defined in [6], wherein positive and negative voltages (±Vcc/2) of substantially the same intensity are respectively applied to a junction between the first and third magnetic detection elements (51/53, 601/603, 611/613, 621/623, 631/633, 701/703, 711/713, 721/723, 731/733) and to a junction between the second and fourth magnetic detection elements (52/54, 602/604, 612/614, 622/624, 632/634, 702/704, 712/714, 722/724, 732/734).

In this aspect, the positive and negative voltages (±Vcc/2) of the same intensity are applied to the current detector with full-bridge configuration to drastically improve the effect of suppressing the change in sensitivity in case that the disturbance magnetic field ΔBb is present.

[8] The current detector defined in [7], wherein the any two magnetic detection elements have the same magnetoresistance change rate and the remaining two magnetic detection elements have the same magnetoresistance change rate.

In this aspect, the change in sensitivity of the current detector is suppressed by substantially equalizing the magnetoresistance change rate in each pair of arbitrarily selected magnetic detection elements.

[9] The current detector defined in [6], wherein voltage is applied to the junction between the first and third magnetic detection elements (51/53, 601/603, 611/613, 621/623, 631/633, 701/703, 711/713, 721/723, 731/733), and the junction between the second and fourth magnetic detection elements (52/54, 602/604, 612/614, 622/624, 632/634, 702/704, 712/714, 722/724, 732/734) is grounded.

In this aspect, in a state that one electrode of the current detector with full-bridge configuration is grounded, voltage (+Vcc) is applied to another electrode to output an output voltage Vout.

[10] The current detector defined in [9], wherein the second and fourth magnetic detection elements have a same magnetoresistance change rate.

In this aspect, in case that one electrode of the current detector with full-bridge configuration is grounded and the voltage (+Vcc) is applied to the other electrode, the change in sensitivity of the current detector is suppressed by substantially equalizing the magnetoresistance change rates of the magnetic detection elements on the ground side.

[11] The current detector (50, 60, 61, 62, 63, 70, 71, 72, 73) defined in any one of [6] to [10], wherein the bias magnetic field generating means (55A/55B) comprises a first bias magnet (55A) provided above the first and second magnetic detection elements on a substrate and a second bias magnet (55B) provided above the third and fourth magnetic detection elements on the substrate.

In this aspect, the magnets are used as the bias magnetic field generating means.

[12] The current detector (50, 60, 61, 62, 63, 70, 71, 72, 73) defined in any one of [6] to [10], wherein the bias magnetic field generating means comprises one bias coil provided above the first, second, third and fourth magnetic detection elements on the substrate.

In this aspect, the bias coil is used as the bias magnetic field generating means. Since the bias magnetic fields in the opposite directions can be supplied to the magnetic detection elements by arranging the four magnetic detection elements on both sides of one bias coil, it is possible to reduce the size of the elements as a whole.

Although the embodiments of the invention have been described, the invention according to claims is not to be limited to the embodiments. Further, it should be noted that all combinations of the features described in the embodiments are not necessary to solve the problem of the invention.

The magnetization direction of the magnetic detection element is preferably orthogonal to the bias magnetic field but an inclination of up to about ±10° from the orthogonal direction is acceptable.

The magnetization directions of the magnetic detection elements constituting the current detector are preferably parallel to each other but an inclination of up to about ±20° is acceptable.

The bias magnetic fields supplied to the magnetic detection elements constituting the current detector are preferably of the same intensity but a difference of up to about ±10% is acceptable.

What is claimed is:

1. A current detector, comprising:
a full-bridge configuration comprising first to fourth magnetic detection elements, the first and second magnetic detection elements being connected in series and disposed such that a magnetization direction of a magnetic pinned layer thereof is opposite to each other, the third and fourth magnetic detection elements being connected in series and disposed such that a magnetization direction of a magnetic pinned layer thereof is opposite to each other, and the first and second magnetic detection elements being connected in parallel to the third and fourth magnetic detection elements; and
a bias magnetic field generating means for applying a bias magnetic field to two arbitrarily selected from the first to fourth magnetic detection elements and to two remaining magnetic detection elements,
wherein the bias magnetic field has a substantially same intensity, and is formed in a direction substantially orthogonal to the magnetization direction and opposite to each other,
wherein the bias magnetic field generating means applies a first bias magnetic field to first and second detection elements and a second bias magnetic field to third and fourth magnetic detection elements, and
wherein the first and second bias magnetic fields are oriented in a direction substantially orthogonal to the magnetization direction of their respective serially-connected magnetic detection elements.

2. The current detector according to claim 1, wherein positive and negative voltages of a substantially same intensity are each applied to a junction between the first and third magnetic detection elements and to a junction between the second and fourth magnetic detection elements.

3. The current detector according to claim 2, wherein the first and second magnetic detection elements have a same magnetoresistance change rate and the third and fourth magnetic detection elements have a same magnetoresistance change rate.

4. The current detector according to claim 1, wherein a voltage is applied to a junction between the first and third magnetic detection elements, and a junction between the second and fourth magnetic detection elements is grounded.

5. The current detector according to claim 4, wherein the second and fourth magnetic detection elements have a same magnetoresistance change rate.

6. The current detector according to claim 1, wherein the bias magnetic field generating means comprises a first bias magnet provided above the first and second magnetic detection elements on a substrate and a second bias magnet provided above the third and fourth magnetic detection elements on the substrate.

7. The current detector according to claim 1, wherein the bias magnetic field generating means comprises one bias coil provided above the first, second, third and fourth magnetic detection elements on the substrate.

8. The current detector according to claim 1, wherein the first and second bias magnetic fields have a substantially same intensity.

9. A current detector, comprising:
a full-bridge configuration comprising first to fourth magnetic detection elements, the first and second magnetic detection elements being connected in series and disposed such that a magnetization direction of a magnetic pinned layer thereof is opposite to each other, the third and fourth magnetic detection elements being connected in series and disposed such that a magnetization direction of a magnetic pinned layer thereof is opposite to each other, and the first and second magnetic detection elements being connected in parallel to the third and fourth magnetic detection elements; and
a bias magnetic field generating means for applying a bias magnetic field to two arbitrarily selected from the first to fourth magnetic detection elements and to two remaining magnetic detection elements,
wherein the bias magnetic field has a substantially same intensity, and is formed in a direction substantially orthogonal to the magnetization direction and opposite to each other,
wherein the bias magnetic field generating means applies a first bias magnetic field to first and second detection elements and a second bias magnetic field to third and fourth magnetic detection elements, and
wherein the first and second bias magnetic fields are opposite in polarity to one another.

10. The current detector according to claim 9, wherein positive and negative voltages of a substantially same intensity are each applied to a junction between the first and third magnetic detection elements and to a junction between the second and fourth magnetic detection elements.

11. The current detector according to claim 10, wherein the first and second magnetic detection elements have a same magnetoresistance change rate and the third and fourth magnetic detection elements have a same magnetoresistance change rate.

12. The current detector according to claim 9, wherein a voltage is applied to a junction between the first and third magnetic detection elements, and a junction between the second and fourth magnetic detection elements is grounded.

13. The current detector according to claim 12, wherein the second and fourth magnetic detection elements have a same magnetoresistance change rate.

14. The current detector according to claim 9, wherein the bias magnetic field generating means comprises a first bias magnet provided above the first and second magnetic detection elements on a substrate and a second bias magnet provided above the third and fourth magnetic detection elements on the substrate.

15. The current detector according to claim 9, wherein the bias magnetic field generating means comprises one bias coil provided above the first, second, third and fourth magnetic detection elements on the substrate.

16. The current detector according to claim 9, wherein the first and second bias magnetic fields have a substantially same intensity.

* * * * *